United States Patent
Singhal

(10) Patent No.: US 9,276,566 B2
(45) Date of Patent: Mar. 1, 2016

(54) DUAL EDGE-TRIGGERED RETENTION FLIP-FLOP

(71) Applicant: Texas Instruments Incorporated, Dallas, TX (US)

(72) Inventor: Vipul Kumar Singhal, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/468,343

(22) Filed: Aug. 26, 2014

(65) Prior Publication Data

US 2015/0188519 A1   Jul. 2, 2015

Related U.S. Application Data

(60) Provisional application No. 61/922,790, filed on Dec. 31, 2013.

(51) Int. Cl.
*H03K 3/289* (2006.01)
*H03K 3/037* (2006.01)
*H03K 19/00* (2006.01)

(52) U.S. Cl.
CPC .......... *H03K 3/0375* (2013.01); *H03K 19/0013* (2013.01)

(58) Field of Classification Search
None
See application file for complete search history.

(56) References Cited

U.S. PATENT DOCUMENTS

| | | | |
|---|---|---|---|
| 6,753,714 B2* | 6/2004 | Gupta | H03K 3/0372 327/202 |
| 7,583,121 B2* | 9/2009 | Berzins | H03K 3/356008 327/202 |
| 2009/0058484 A1* | 3/2009 | Rao | H03K 3/012 327/202 |

* cited by examiner

*Primary Examiner* — Long Nguyen
(74) *Attorney, Agent, or Firm* — Lawrence J. Bassuk; Frank D. Cimino

(57) ABSTRACT

A dual edge triggered retention flip-flop reduces clock tree power dissipation in an active mode and leakage power in a low-power (e.g., standby) mode. For example, a first latch can be used to latch a first state of an input to a flip-flop in response to a first (e.g., positive-going) edge of a clock signal and a second latch can be used to latch a second state of the input to the flip-flop in response to a second (e.g., negative-going) edge of a clock signal. A retention latch can be used to latch and retain the state of the flip-flop when the first and second latches are disabled to save power in the low-power mode. The retention latch can also be used to initialize at least one of the first and second flip-flops when exiting the low-power mode.

17 Claims, 9 Drawing Sheets

DUAL EDGE-TRIGGERED RETENTION FLIP-FLOP

CROSS-REFERENCE TO RELATED APPLICATION

This application claims priority to: (a) U.S. Provisional Patent Application Ser. No. 61/922,790, filed Dec. 31, 2013, entitled DUAL EDGE-TRIGGERED RETENTION FLIP-FLOP, naming Vipul Singhal as inventor. All of the above-identified applications are hereby fully incorporated herein by reference for all purposes.

BACKGROUND

Electronic circuits are designed using increasingly smaller design features to attain increased integration and reduced power consumption. An example of such increasingly integrated circuits, includes SoC (System on Chip) designs implemented using VLSI (very large scale integration). Power management (including controlling power consumption and heat dissipation) are significant design concerns in such VLSI circuits. For example, the rate and amounts of power consumption affects the operating temperatures, lifetimes, battery longevity for mobile devices, and the like, of the devices incorporating the VLSI circuits. However, as the design features of integrated circuits are increasingly made smaller, variability of the electrical characteristics of the components increasingly jeopardizes proper operation of the integrated circuits.

SUMMARY

In general, an implementation of the subject matter disclosed herein is directed to a dual edge triggered retention (DETRET) flip-flop. DETRET flip-flops include circuitry that is arranged to trigger on a leading edge of a clock signal and a trailing edge of the clock signal which can result in reduced power dissipation due to slower operating frequencies required of the clock signal. However, conventional DETRET flip-flops typically use pulse generation circuitry (such as a serial chain of inverters) to generate internal control signals for the DETRET flip-flops. As smaller design features are used, the performance-critical pulse generators can become non-reliable (e.g., due to high transistor-variability and lower operating voltages). As disclosed herein, an example DETRET flip-flop is arranged to trigger on the leading edge and trailing edge of the clock signal without requiring, for example, internal pulse generation circuits, substantially increased layout areas, or substantially increased operating power consumption.

In one or more implementations, the DETRET flip-flop also includes circuitry that is configured to retain a state of the data during a low power and/or standby modes of operation. In an example implementation, the circuitry that is configured to retain the state of the data during low power and/or standby modes of operation that reduces the switching power consumed by the clock tree.

This Summary is submitted with the understanding that it is not be used to interpret or limit the scope or meaning of the claims. Further, the Summary is not intended to identify key features or essential features of the claimed subject matter, nor is it intended to be used as an aid in determining the scope of the claimed subject matter.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Certain terms are used throughout the following description—and claims—to refer to particular system components. As one skilled in the art will appreciate, various names may be used to refer to a component. Accordingly, distinctions are not necessarily made herein between components that differ in name but not function. In the following discussion and in the claims, the terms "including" and "comprising" are used in an open-ended fashion, and thus are to be interpreted to mean "including, but not limited to . . . ." Also, the terms "coupled to" or "couples with" (and the like) are intended to describe either an indirect or direct electrical connection. Thus, if a first device couples to a second device, that connection can be made through a direct electrical connection, or through an indirect electrical connection via other devices and connections.

Power dissipation is an important parameter in the design of VLSI circuits (very large scale integrated circuits) used in SoC (System on Chip) electronic devices. The clock network in these devices is responsible for a significant portion of power consumption and/or current leakage. For example, clock switching can consume upwards of forty percent or more of the total consumed power in a digital block of the SoC device when the block is in active mode. To minimize power consumption, "power-gating" is used (for example) to disconnect and reconnect power from power domains in idle portions of blocks in the SoC device. In power-saving modes of operation, digital blocks of the SoC are often arranged to retain the state of the data contained in each block.

Disclosed herein is a computing device that is disposed on a substrate and which includes a dual edge triggered retention (DETRET) flip-flop. The DETRET flip-flop is arranged to reduce clock power during active mode (for example, by alternately clocking latches with complementary (e.g., positive and negative) edges of a system clock, which halves the operating frequency while maintaining data throughput in the computing device circuitry) and to retain the state of data in the computing device circuitry during low-power modes of operation.

Figure 1:
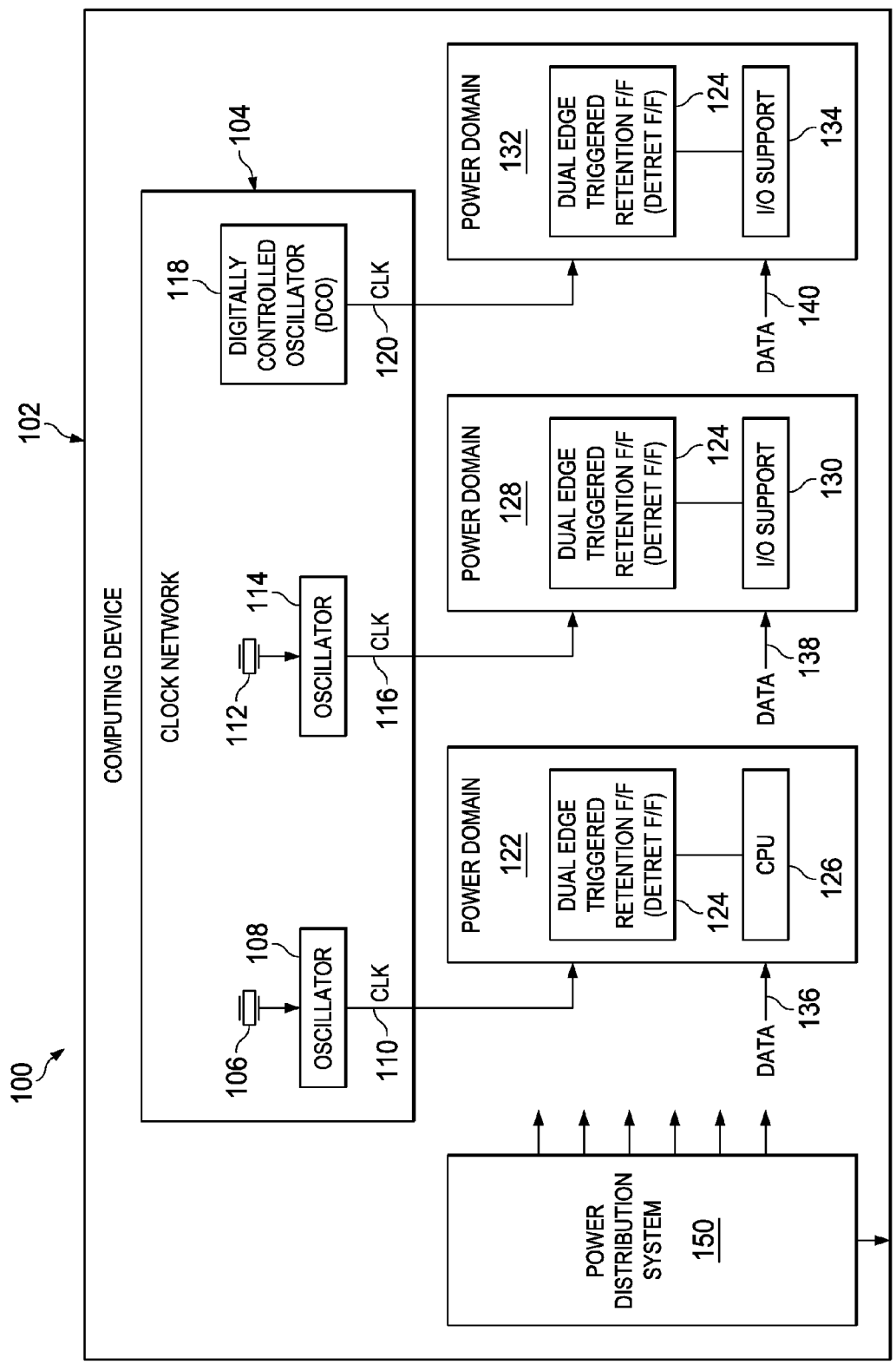
FIG. 1 shows an illustrative computing device in accordance with exemplary embodiments of the disclosure.

FIG. 1 shows an illustrative computing device 102 on a substrate 100 in accordance with exemplary embodiments of the disclosure. The illustrated computing device 102 includes a clock network 104. The illustrated clock network 104 includes a crystal 106 that provides a frequency signal to an oscillator 108 to generate a CLK signal 110. The illustrated clock network 104 also includes a crystal 112 that provides a frequency signal to an oscillator 114 to generate a CLK signal 116. The illustrated clock network 104 additionally includes digitally controlled oscillator (DCO) 110 that generates a CLK signal 120.

Although the computing device 102 is described in terms of a processor, the dual edge triggered retention (DETRET) flip-flop also can be implemented in a various system components (such a memory, bus, or system controllers, co-processors, cache logic, and the like) with or without the use of processor logic. Accordingly, the computing device 102 includes many (if not all) flip-flops that are implemented using the DETRET flip-flop, and the DETRET flip-flop can be instantiated in any of the system components (shown or not shown) of system 102.

The illustrated computing device 102 includes one or more power domains, each having one or more dual edge triggered retention (DETRET) flip-flops along with other circuitry. For example, the illustrated power domain 122 includes a dual edge triggered retention (DETRET) flip-flop 124 and a central processing unit (CPU) 126, a power domain 128 includes the dual edge triggered retention (DETRET) flip-flop 124 and input/output (I/O) support 126, and a power domain 132 includes the dual edge triggered retention (DETRET) flip-flop 124 and input/output (I/O) support 134 block.

Each power domain in the computing device 102 is illustrated as having its own clock source. For example, the clock source for the illustrated power domain 122 is the CLK signal 110, the clock source for the power domain 128 is the CLK signal 116, and the clock source for the power domain is the CLK signal 120. (In other exemplary embodiments, different power domains can share—including selectively share—a clock source.)

Each power domain in the computing device 102 is coupled to a data source. For example, the illustrated power domain 128 is coupled to a data source 136, the illustrated power domain 128 is coupled to the data source 138, and the illustrated power domain 132 is coupled to a data source 140. In other exemplary embodiments, different power domains can share—including selectively share—a data source. Likewise, data output from a first power domain can be used as a data source of a second power domain.

Each power domain is arranged having one or more selectively coupled power supplies via power distribution system 150. For example, portions of the DETRET flip-flop 124 can selectively remain powered on (such as a data state retention latch is arranged to maintain an active state during a low-power operating mode), while other portions of the DETRET flip-flop 124 are selectively powered down (such as non-retention latches that are arranged to be powered-down during the low-power operating mode).

In one or more implementations, the illustrated substrate 100 includes a microcontroller, a microprocessor, or other suitable electronic circuit, for processing commands and/or data.

In one or more implementations, the computing device 102 is incorporated into a personal computing device, such as a cell phone, a laptop computer, digital versatile disk (DVD) player, a desktop computer, a tablet computer, or the like. The computing device 102 typically includes one or more embedded analog mixed-signal (AMS) "intellectual property" (IP) cores arranged as a systems-on-chip (SoCs), where the SoC is arranged on a common substrate such as substrate 100.

In one or more implementations, the clock network 104 is any suitable clock distribution network and/or clock tree that provides clocks for the computing device 102. The clocks may be synchronized with each other.

In one or more implementations, the crystals 106 and 112 are any suitable circuit device that uses a physical resonance of a vibrating crystal of piezoelectric material to generate an electrical signal of a particular frequency (i.e., a clock signal). For example, the crystal 106 may be a quartz crystal.

In one or more implementations, the oscillators 108 and 114 are any suitable circuit that is capable of receiving the electrical signal from a crystal (106 and 112, respectively) and generating an oscillating signal as a time basis for a clock signal. For example, the oscillator 108 uses the crystal 106 to generate the clock signal 110.

In one or more implementations, the power domains 122, 128, and/or 132 may be any suitable block of circuitry that that is capable of being powered up during the active mode of the computing device 102 and powered down during the one or more low-power modes of the computing device 102. Although the implementation is illustrated as having three power domains, there may be more or fewer than three power domains. Additionally, all power domains might not be simultaneously powered down to enter one or more low-power operating modes of the computing device 102.

For example, some power domains may be powered on even when the computing device 102 is in a low-powered mode. Additionally, whether or not the computing device 102 goes into a low-power mode may depend on the type of device of which the computing device 102 is a part. For example, in battery-powered devices, the battery charging portion of the computing device 102 might always be "on" even when the battery-powered device is considered to be powered "off."

In one or more implementations, the dual edge triggered retention flip-flops (DETRET flip-flop) 124 in the power domains 122, 128, and/or 132 are circuitry that reduce clock power consumption of each of the power domains 122, 128, and/or 132 during active mode of the computing device 102. The power consumption is reduced (over conventional flip-flops, for example) because the clock of each power domain 122, 128, and/or 132 is arranged to run at half of a respective operating frequency while maintaining the data throughput (rate) in each respective power domains 122, 128, and/or 132. The DETRET flip-flop 124 also is configured to retain the state of data in the circuitry in the respective power domains 122, 128, and/or 132 during low-power modes of operation (such as "sleep," "hibernation," "dormant," "standby," and the like power-saving modes) of the computing device 102. The DETRET flip-flops are described in more detail with reference to FIG. 2.

In one or more implementations, the CPU 126 is a Complex Instruction Set Computer (CISC)-type CPU, a Reduced Instruction Set Computer (RISC)-type CPU, a digital signal processor (DSP), or the like. The CPU 126 also can be a programmable digital module or any device that is used to process signals or data.

In one or more implementations, the I/O support 130 and/or I/O support 134 may be any suitable circuitry that supports peripheral devices. For example, the I/O support 130 and/or I/O support 134 may be arranged for serial or parallel communications, for communication with peripheral devices or networked devices, in either operational or "test" modes. For example, a serial scan chain can be provided (as discussed below) for scan chain-based testing that exposes internal nodes of the computing device 102 for functional verification.

In one or more implementations, the computing device 102 utilizes an active operating mode. In the active operating mode, the crystal 106 actively provides a frequency signal to the oscillator 108 and the resulting CLK signal 110 is active and is provided to the power domain 122. Also in the active operating mode the computing device 102, the crystal 112 actively provides a frequency signal to the oscillator 114 and the resulting CLK signal 116 is active and is provided to the power domain 128. Additionally, in the active operating mode the computing device 102 the DCO 118 is active and provides the CLK signal 120 to the power domain 122.

In one or more implementations, the computing device 102 utilizes one or more power-saving modes of operation. For example, in a first low-power operating mode the CPU 126 and the CLK signal 110 are disabled. Also in the first low-power operating mode CLK signal 116 and the CLK signal 120 remain active.

In a second low-power operating mode, the CPU 126 and the CLK signal 110 are disabled, and the CLK signals 116 and 120 remain active. Also in the second low-power operating mode the oscillator and/or feedback controller in the DCO 118 may be disabled if the DCO 118 is not used in the active mode.

In a third low-power operating mode, the CPU 126, the CLK signal 110, and the CLK signal 120 are disabled, and the CLK signal 116 remains active. Also in the third low-power operating mode the DCO 118 remains active even though the CLK signal 120 is disabled.

In a fourth low-power operating mode, the CPU 126, the CLK signal 110, the CLK signal 120, and the DCO 118 are disabled. Also in the fourth low-power operating mode the CLK signal 116 remains active.

In a fifth low-power operating mode, the CPU 126, the CLK signal 110, the CLK signal 116, the CLK signal 120, the DC generator in the DCO 118 are disabled. Also in the fifth low-power operating mode the crystals 106 and 112 are stopped.

Accordingly, individual sub-systems can be selectively powered-up or down for a selected power-saving mode. For example, in a standby mode, the oscillators can be left running (to eliminate the need for temperature stabilization and phase-locking), and in a hibernate mode, clocked logic (having the disclosed DETRET discussed below) can remain unclocked (thus conserving power) while retained a latched data state.

Figure 2:
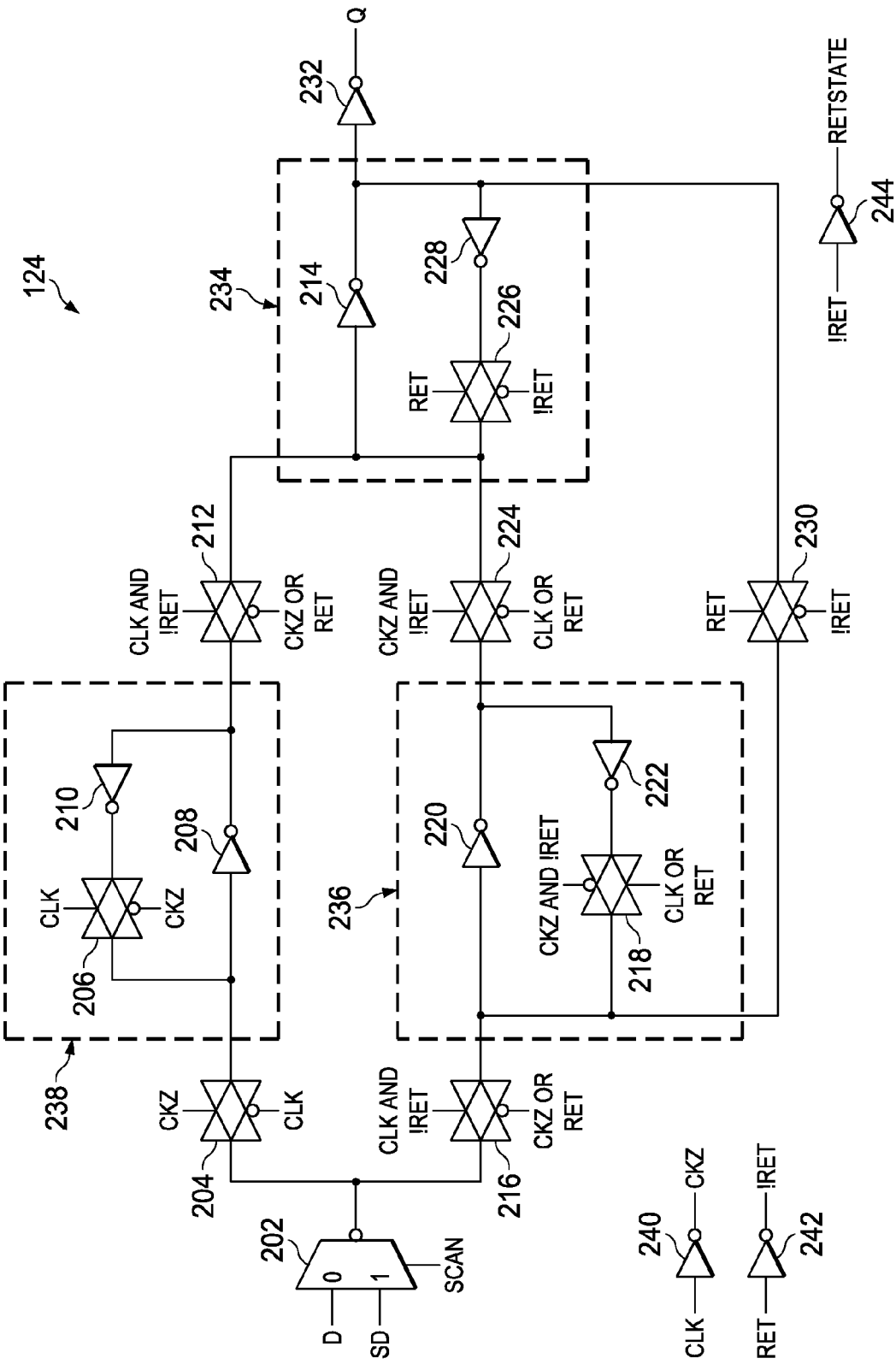
FIG. 2 is a schematic diagram illustrating a dual edge triggered retention (DETRET) flip-flop in accordance with exemplary embodiments of the disclosure.

FIG. 2 is a schematic diagram illustrating a dual edge triggered retention (DETRET) flip-flop 124 in accordance with exemplary embodiments of the disclosure. The illustrated DETRET flip-flop 124 includes a data signal input D, a scan data signal input SD, and an output Q. The illustrated DETRET flip-flop 124 also receives a clock signal CLK, a SCAN signal, and a retain signal RET In one or more implementations, the SCAN signal is used to determine which of the inputs (D or SD) is to be latched. Accordingly, the multiplexer 202 receives the data signal input D, the data signal input SD, and a SCAN signal input and outputs the selected input signal to an input of a transmission gate 204 and transmission gate 216, where each transmission gate is coupled to the input of a latch and where each transmission gate is alternately gated in response to the CLK signal. Thus, the D input or the SD input can be sampled (and latched) by the DETRET flip-flop 124 on alternate states of the CLK signal.

The data presented to the D input (and the SD input) is presented at a rate that is twice the rate of the nominal frequency of the CLK signal. Thus, the DETRET flip-flop 124 is arranged to, on the on the positive transition of the CLK, sample a first data value of the selected input (one of signal D or signal SD as selected by the SCAN signal), and, on the negative transition of the CLK, sample a second data value of the selected input. The sampled data, as discussed further below, is alternately sent to the output Q on complementary transitions of the CLK signal. When the SCAN signal is asserted, the SD input is (instead of the D input) sampled at a frequency that is twice the nominal frequency of the CLK signal. Thus, the DETRET is arranged, for example, to sample data for performing scan chain-based testing that provides stimulus for and exposes internal nodes of the DETRET flip-flop 124 for purposes of functional verification.

The illustrated DETRET flip-flop 124 also receives a "retain" signal (e.g., signal RET) that is arranged to selectively toggle the DETRET flip-flop 124 between a low-power data-retention mode and an operational mode. Signals RET and CLK are used to control the transmission gates used to latch and select outputs of the various latches, as described below. Inverter 240 is arranged to generate an inverted clock signal CKZ by inverting the state of the CLK signal, while inverter 242 is arranged to generate an inverted retain signal "!RET" by inverting the state of the RET signal.

An output of the transmission gate 204 is coupled to an output of a transmission gate 206 and an input to an inverter 208. An input of the transmission gate 206 is coupled to an output of an inverter 210. The output gate of multiplexer 202 is arranged to more strongly drive (via transmission gate 204) the input of inverter 208 (as compared with the drive strength of inverter 210) and thus change the output state of the inverter 208. The transmission gate 206, the inverter 208, and the inverter 210 form a latch 238. Thus, the state of the latch 238 is changed when transmission gate 204 is activated (during a low phase of signal CLK) and the outputs of the multiplexer 202 and the inverter 210 are in complementary states. An input of the inverter 210 is coupled to an output of the inverter 208 and to an input of a transmission gate 212. An output of the transmission gate 212 is coupled to an input of an inverter 214.

An output of the transmission gate 216 is coupled to an output of a transmission gate 218 and an input to an inverter 220. An input of the transmission gate 218 is coupled to an output of an inverter 222. The output gate of multiplexer 202 is arranged to more strongly drive (via transmission gate 216) the input of inverter 220 (as compared with the drive strength of inverter 222) and thus change the output state of the inverter 220. The transmission gate 218, the inverter 220, and the inverter 222 form a latch 236. Thus, the state of the latch 236 is changed when transmission gate 216 is activated (during a high phase of signal CLK and when RET is not asserted) and the outputs of multiplexer 202 and the inverter 222 are in complementary states. An input of the inverter 222 is coupled to an output of the inverter 220 and to an input of a transmission gate 224. An output of the transmission gate 224 is coupled to an input of the inverter 214. Transmission gate 212 and transmission gate 224 are arranged as a multiplexer that, in active mode, selects the output of either of the latch 238 or latch 236 in response to the state of signal CLK.

The output of inverter 214 is inverted by inverter 228, which in turn, has an output that is gated by transmission gate 226. The transmission gate 226, the inverter 214, and the inverter 228 form a retention latch 234 (which, e.g., is not powered down during a low-power mode). For example, during a high phase of signal CLK, transmission gate 212 is transparent, and thus the output of latch 238 is used to set the input state of retention latch 234. During a low phase of signal CLK, transmission gate 224 is transparent, and thus the output of latch 236 is used to set the input state of retention latch 234. However, the illustrated retention latch 234 does not latch the (selected) input signal until the signal RET is asserted. When signal RET is asserted, the transmission gates 212 and 224 are deactivated (non-transparent), and the transmission gate 226 is activated (transparent), which feeds-back that output to input of the retention latch 234, and thus latches the input signal (in retention latch 234) of the last selected output of either latch 238 or latch 236.

The output of the retention latch 234 (e.g., at the output of inverter 214) is used as an output for the DETRET latch 124 (via inverter 232) and is also used to set the state of (for example) latch 236 such that when signal RET is de-asserted (and, e.g., the circuit powers-up from a low-power mode), the retained state (of retention latch 234) is latched by latch 236. Because the circuit embodying latch 236 is powered-down (while the retention latch 234 remains powered for state-retention), latch 236 is not activated until the RET signal is de-asserted as described below with respect to the following Figures. Thus, as RET is asserted, the transmission gate 230 goes transparent, but its transparency plays no (initial) role during powering down of the computing device 102 to a low-power operating mode. (It instead is used to setup an input value for latch 236 during a power-up sequence while recovering from the low-power mode.)

The retention signal RET can be provided as an output for a particular DETRET flip-flop 124 to indicate that the flop is in retention mode. Because power-gated latches inside the flop can have random values after being powered up, the output retention signal RET can be used to warn logic circuits to wait for the THR (threshold) 402 before accepting an output from a DETRET flip-flop 124 that is powered down or is still being powered up. For example, inverter 244 is arranged to convey the state (RETSTATE) of the DETRET flip-flop 124 by outputting the inversion of the "!RET" signal.

The illustrated transmission gates 204, 206, 212, 216, 218, 224, 226, and 230 are analog switches that selectively block or pass a signal level from their inputs to their outputs. Each transmission gate 204, 206, 212, 216, 218, 224, 226, and 230 can be solid state switches comprised of a pMOS (P-type metal-oxide-semiconductor) transistor and an nMOS (N-type metal-oxide-semiconductor) transistor.

Control gates for the transmission gates 204, 206, 212, 216, 218, 224, 226, and 230 are biased in a complementary way such that both pMOS and nMOS transistors are biased either ON or OFF. For example, when a control signal is logic high on the active-high node of the transmission gates the complementary control signal is logic low on the active-low node of the transmission gates. This allows the transmission gates to pass the signal on the input of the transmission gates to the output of the transmission gates.

Alternatively, when the control signal is logic low on the active-high node of the transmission gates the complementary control signal is logic high on the active-low node of the transmission gates. This places the transmission gates in a high impedance state and prevents the transmission gates from passing the signal on the input of the transmission gates to the output of the transmission gates.

Operation of the illustrated DETRET 124 during a power-down sequence is described herein with reference to FIG. 2, FIG. 3, FIG. 4, and FIG. 5.

Figure 3:
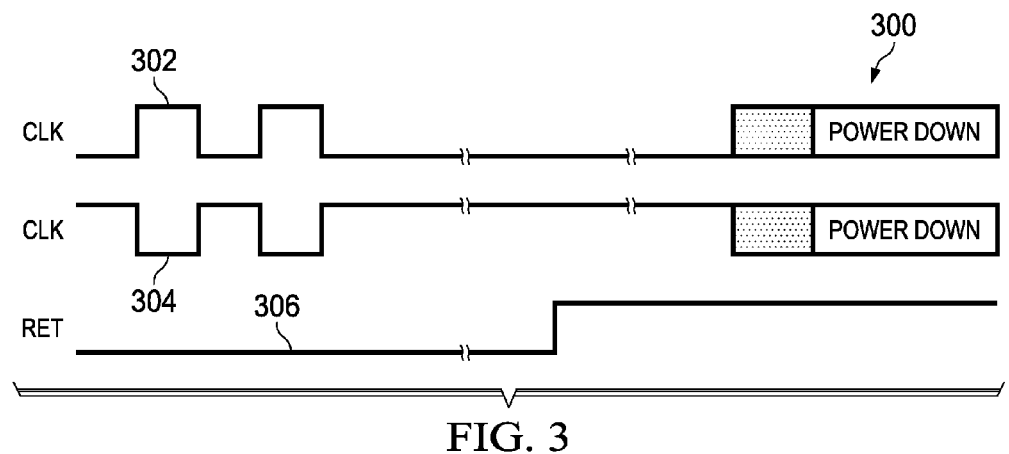
FIG. 3 is a timing diagram illustrating a power-down sequence for the computing device illustrated in FIG. 1 using the DETRET illustrated in FIG. 2 in accordance with exemplary embodiments of the present disclosure.

FIG. 3 is a timing diagram 300 illustrating a power-down sequence for the computing device 102 using the DETRET 124 in accordance with exemplary embodiments of the present disclosure. The illustrated timing diagram 300 includes a clock signal CLK 302 and a clock signal CLK 304, which illustrates that the clock signal can be either logic high (302) or logic low (304) at the time the signal RET 306 is asserted in preparation for entering a low-power mode (POWER DOWN). The timing diagram 300 illustrates that the computing device 102 can enter a low-power mode when the clock signal is a logic low or a logic high. For example, the clock signal is stable (e.g., stopped) at least one state before entering the low power state.

In one or more implementations, the retention signal RET 306 transitions to a logic high. Once the retention signal RET 306 transitions to a logic high, data that is present at the retention latch 234 is stored in the retention latch 234. The data remains stored in the retention latch 234 because the retention latch remains powered throughout the low-power modes (such as a standby, hibernate, sleep, and the like mode). Also, once the retention signal RET 306 transitions to a logic high the transmission gate 230 becomes transparent to couple the latched value of the retention latch 234 to the input of latch 236 (as described above with reference to FIG. 2).

Figure 4:
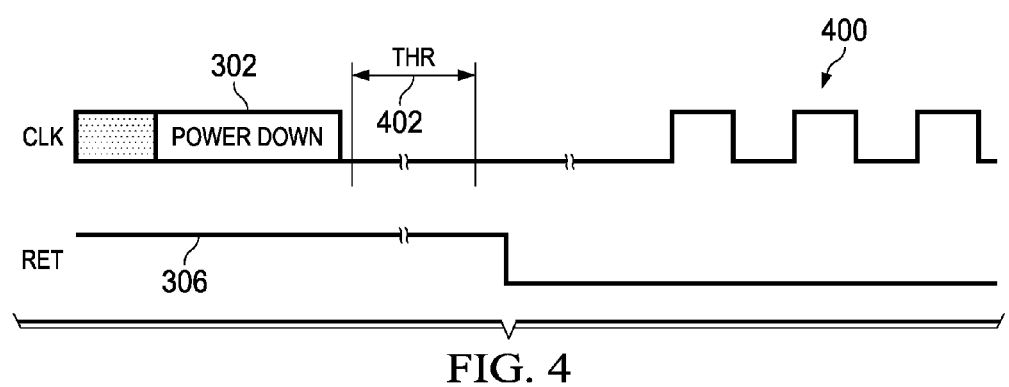
FIG. 4 is a timing diagram illustrating a power-up sequence for the computing device illustrated in FIG. 1 using the DETRET illustrated in FIG. 2 in accordance with exemplary embodiments of the present disclosure.

FIG. 4 is a timing diagram 400 illustrating a power-up sequence for the computing device 102 using the DETRET 124 in accordance with exemplary embodiments of the present disclosure. The illustrated timing diagram 400 shows the power-up sequence and includes the clock signal CLK 302 and the retention signal RET 306. In one or more implementations, the retention signal RET 306 remains logic high (asserted) until the clock signal CLK 302 settles to a logic low for a period of time THR (threshold) 402, which is the time required for transmission gate 230 to write into latch 236. After the retention signal RET 306 transitions (e.g., out of the data retention state during a low power mode) to a logic low, data that is stored in the retention latch 234 is written back to the non-retention latch 236 via the transmission gate 230.

The retention signal RET can be provided as an output for a particular DETRET flip-flop 124 to indicate that the flop is in retention mode. Because power-gated latches inside the flip-flop can have random values after being powered up, the output retention signal RET can be used to warn logic circuits to wait for the THR (threshold) 402 before accepting an output from a DETRET flip-flop 124 that is being powered up. Accordingly, the assertion/de-assertion of the retention signal RET can occur asynchronously with respect a system clock, for example, without causing any transitions (e.g., "glitches") at the output of any DETRET flip-flop 124.

Additionally, as long as the RET signal is high, the DETRET flip-flop 124 is arranged to be "locked" such that any toggling of input signals such as CLK, D, SD, and SCAN do not have any impact on the stability of the Q output (if powered up during a low-power mode), or retained data (if power gated, such as when operational power is removed in a low-power mode).

Figure 5:
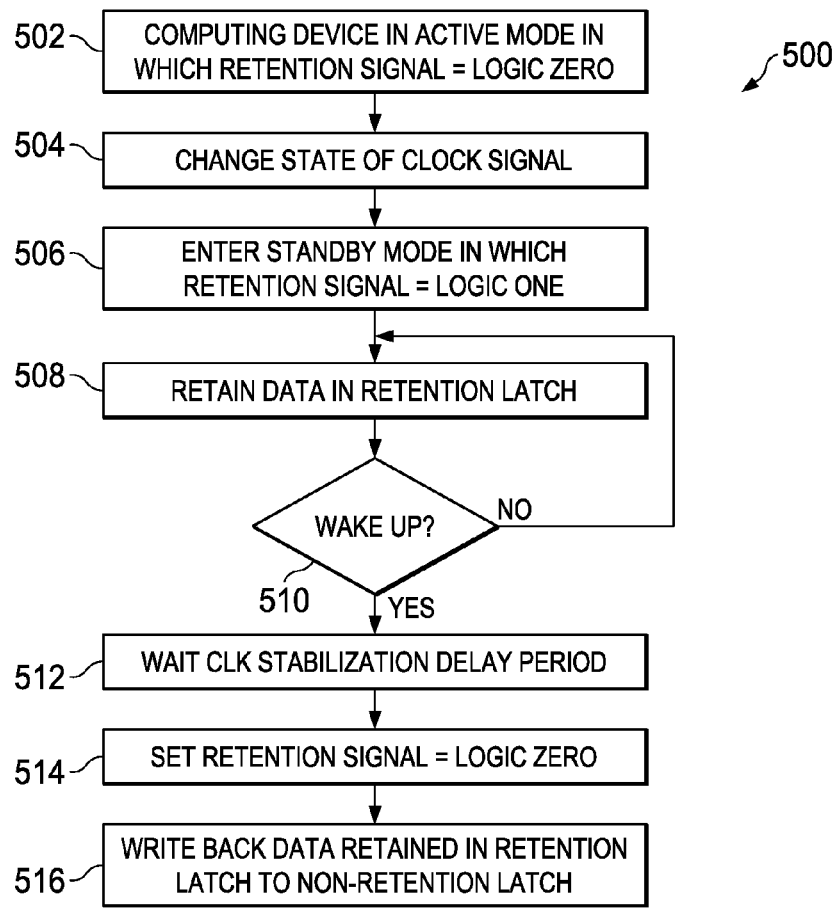
FIG. 5 illustrates a flow diagram illustrating a power-up sequence and a power-down for the computing device illustrated in FIG. 1 using the DETRET illustrated in FIG. 2 in accordance with exemplary embodiments of the present disclosure.

FIG. 5 is a flow diagram illustrating a method 500 for powering-up sequence and powering-down the computing device 102 using the DETRET 124 in accordance with exemplary embodiments of the present disclosure.

In a block 502, the computing device 102 is in an active mode. In the active mode, the retention signal RET 306 in the DETRET 124 is a logic low (and the SCAN signal selects the D input). Also in the active mode of the computing device 102, the clock signal CKZ can be (for example for purposes of illustration) logic high on the active-high node of the transmission gates 204 and 206 the complementary clock signal CLK can be logic low on the active-low node of the transmission gates 204 and 206. This allows the transmission gate 204 to pass the data signal D present at the input of the transmission gate 204 to the output of the transmission gate 204, which couples data signal D to the input of latch 238. When CLK is low at the active-high node of the transmission 212, the transmission gate 212 is non-transparent.

When signal CLK is low, transmission gate 218 is activated (establishing a feedback path) and latch 236 latches the logic state of the input data signal in latch 236. After CLK transitions low (and the retention signal still remains de-asserted), the output of transmission gate 224 is coupled to the input of inverter 214, which is coupled to inverter 232 that drives output Q.

In a block 504, CLK transitions high, transmission gate 206 is activated (establishing a feedback path) and latch 238 latches the logic state of the input data signal (with transmission gate 204 now being deactivated). After CLK transitions high (and the retention signal still remains de-asserted), the output of transmission gate 212 is coupled to the input of inverter 214, which is coupled to inverter 232 that drives output Q.

When CLK is high and with the retention signal RET low (thus still in the active mode), the transmission gate 204 is arranged to pass the data signal D on the input of the transmission gate 216 to the output of the transmission gate 216. When CLK is high at the active-high node of the transmission 224, the transmission gate 224 is non-transparent.

In a block 506, the retention signal RET is asserted, which initiates a transition into a low-power mode (such as a standby mode). The clock signal CLK may be either logic high or logic low. To enter a low-power operating mode the retention signal RET transitions to logic high.

In a block 508, the computing device 102 retains data state of the DETRET 124 in the retention latch 234 of the DETRET 124. In one or more implementations, when the data retention signal RET goes to logic high the data signal that is on the input of the retention latch 234 is stored in the retention latch 234 when transmission gate 226 establishes a feedback path in response to the data retention signal RET. The data remains stored in the retention latch 234 throughout the low-power mode. Additionally, the transmission gate 230 goes transparent.

In a block 510, the computing device 102 determines whether it is to wake up from the standby mode. If the computing device 102 determines that it is to remain in a low-power mode, then control of the method returns to block 508 and the computing device 102 remains in low-power mode. The retention signal RET 306 in the DETRET 124 remains logic high.

If in block 510 it is determined that the computing device 102 is to wake up from the standby mode, then control of the method passes to a block 512. In block 512, the DETRET 124 waits for the CLK stabilization delay period to elapse. In cases where power has been removed from the latches 236 and 238, power is reapplied to the circuitry.

In a block 514, the retention signal RET 306 in the computing device 102 is set to logic low.

In a block 516, the data stored in the retention latch 234 of the DETRET 124 is written back to the non-retention latch 236 and the computing device re-enters active mode.

Figure 6:
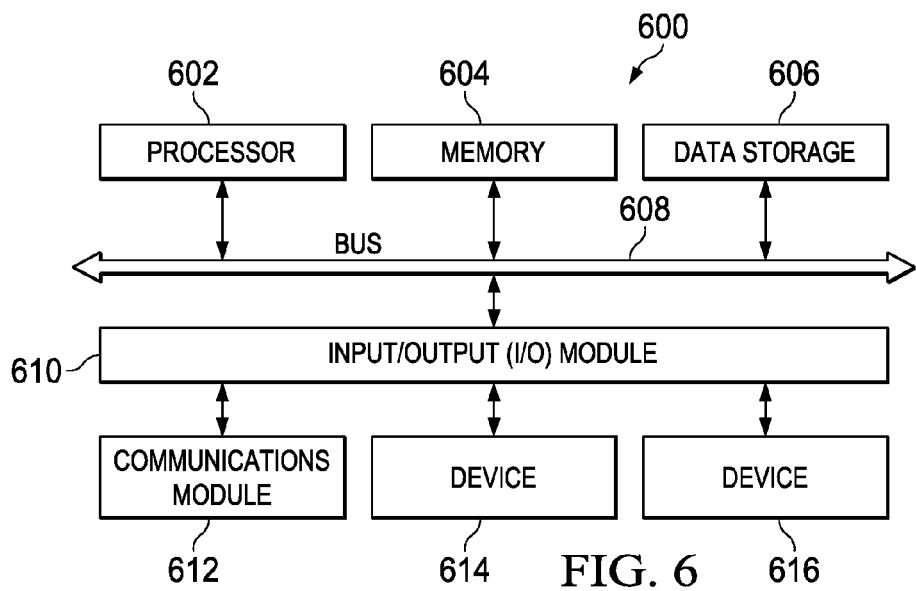
FIG. 6 is a high-level block diagram illustrating an example computer system device in accordance with exemplary embodiments of the disclosure.

FIG. 6 is a high-level block diagram illustrating an example computer system 800 suitable for implementing the computing device 102 of FIG. 1. In certain aspects, the computer system 600 may be implemented using hardware or a combination of software and hardware.

The illustrated computer system 600 includes a processor 602, a memory 604, and data storage 606 coupled to a bus 608 or other communication mechanism for communicating information. An input/output (I/O) module 610 is also coupled to the bus 608. A communications module 612, a device 614, and a device 616 are coupled to the I/O module 610.

The processor 602 may be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable entity that can perform calculations or other manipulations of information. The processor 602 may be used for processing information. The processor 602 can be supplemented by, or incorporated in, special purpose logic circuitry.

The memory 604 may be Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device used for storing information, a computer program, and/or instructions to be executed by the processor 602. They memory 604 may store code that creates an execution environment for one or more computer programs used to implement technology described herein.

A computer program as discussed herein does not necessarily correspond to a file in a file system. A computer program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network.

Unless indicated otherwise by the context, a module refers to a component that is hardware, firmware, and/or a combination thereof with software (e.g., a computer program.) A computer program as discussed herein does not necessarily correspond to a file in a file system. A computer program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network.

The instructions may be implemented in one or more computer program products, i.e., one or more modules of computer program instructions encoded on one or more computer readable media for execution by, or to control the operation of, the computer system 600, and according to any method well known to those of skill in the art. The term "computer-readable media" includes computer-storage media. For example, computer-storage media may include, but are not limited to, magnetic storage devices (e.g., hard disk, floppy disk, and magnetic strips), optical disks (e.g., compact disk (CD) and digital versatile disk (DVD)), smart cards, flash memory devices (e.g., thumb drive, stick, key drive, and SD cards), and volatile and non-volatile memory (e.g., random access memory (RAM), read-only memory (ROM.)).

The data storage 606 may be a magnetic disk or optical disk, for example. The data storage 606 may function to store information and instructions to be used by the processor 602 and other components in the computer system 600.

The bus 608 may be any suitable mechanism that allows information to be exchanged between components coupled to the bus 608. For example, the bus 608 may be transmission media such as coaxial cables, copper wire, and fiber optics, optical signals, and the like.

The I/O module 610 can be any input/output module. Example input/output modules 610 include data ports such as Universal Serial Bus (USB) ports.

The communications module 612 may include networking interface cards, such as Ethernet cards and modems.

The device 614 may be an input device. Example devices 614 include a keyboard, a pointing device, a mouse, or a trackball, by which a user can provide input to the computer system 600.

The device 616 may be an output device. Example devices 616 include displays such as cathode ray tubes (CRT) or liquid crystal display (LCD) monitors that display information, such as web pages, for example, to the user.

Figure 7:
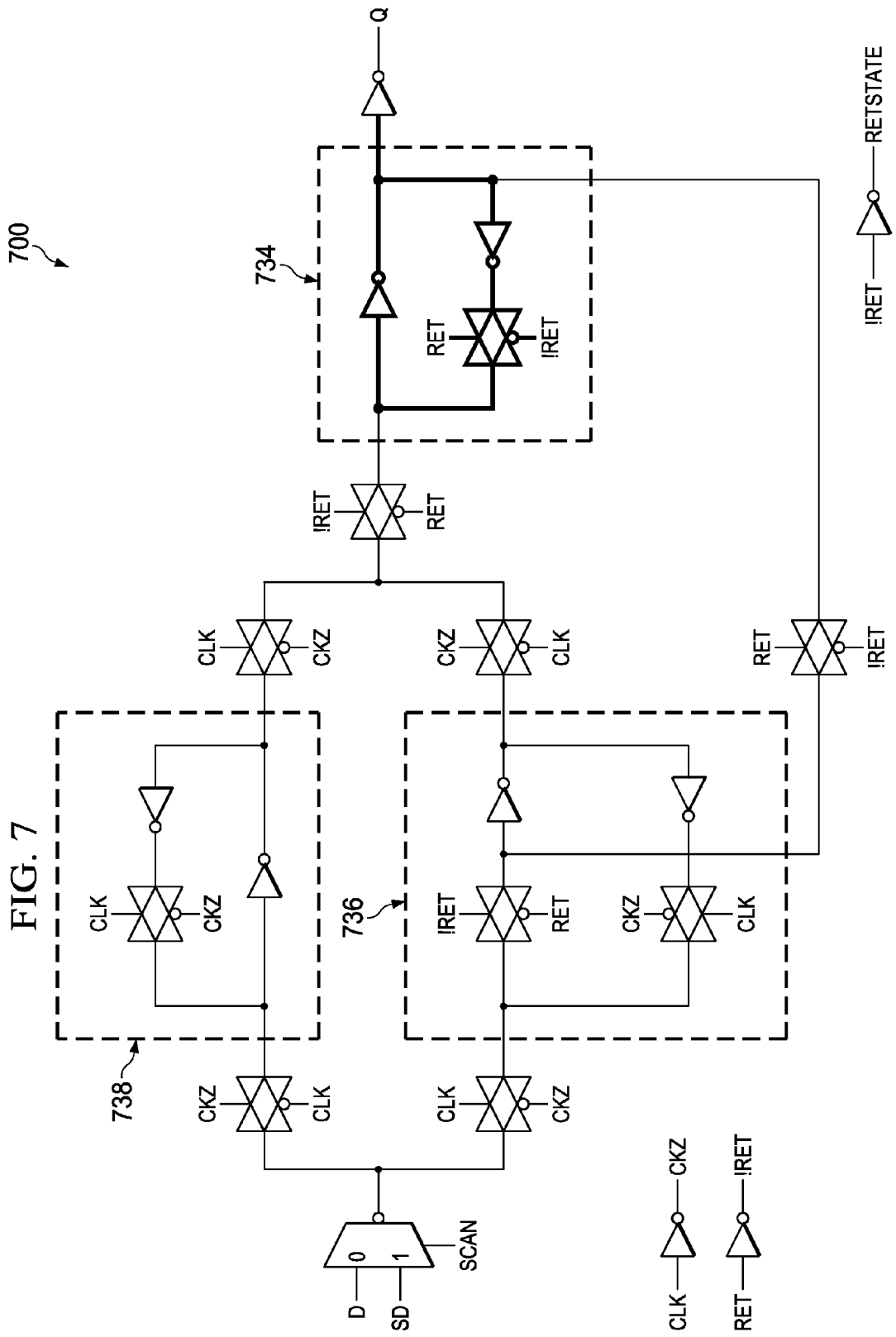
FIG. 7 is a schematic diagram illustrating a low-power dual edge triggered retention (DETRET) flip-flop 700 in accordance with exemplary embodiments of the disclosure.

FIG. 7 is a schematic diagram illustrating a low-power dual edge triggered retention (DETRET) flip-flop 700 in accordance with exemplary embodiments of the disclosure. The illustrated DETRET flip-flop 700 includes input latches 738 and 736, each of which has an output that is selectively coupled to output latch 734. In comparison with the DETRET flip-flop 124, DETRET flip-flop 700 includes transmission gate 750, which is transparent when the retain signal (RET) is not asserted. Thus, certain control signals that are derived from the clock signal (such as CLK&!RET as well as CKZ&!RET) are not generated, which saves power that would otherwise be dissipated during transitions of the clock signal.

Figure 8:
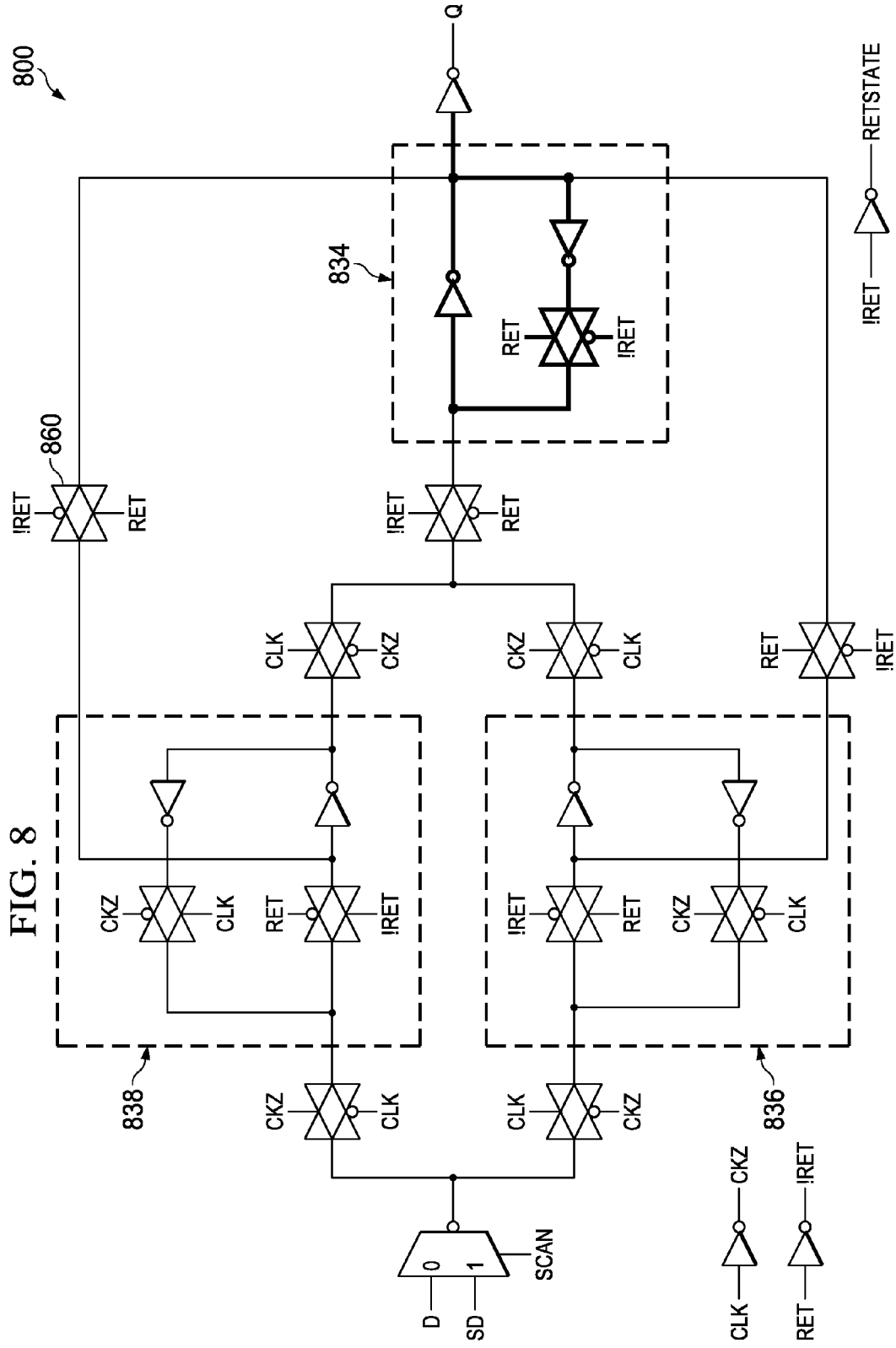
FIG. 8 is a schematic diagram illustrating a fast wakeup dual edge triggered retention (DETRET) flip-flop 800 in accordance with exemplary embodiments of the disclosure.

FIG. 8 is a schematic diagram illustrating a fast wakeup dual edge triggered retention (DETRET) flip-flop 800 in accordance with exemplary embodiments of the disclosure. The illustrated DETRET flip-flop 800 includes input latches 838 and 836, each of which has an output that is selectively coupled to output latch 834. In comparison with the DETRET flip-flop 700, DETRET flip-flop 800 includes transmission gate 860. Transmission gate 860 provides a (feedback) path that is used to set the state of a second latch (e.g., input latch 838) when the DETRET flip-flop 800 transitions from a low-power operating mode to a normal operating mode. The second path allows the DETRET flip-flop 800 to transition from a low-power operating mode irrespectively of the phase (e.g., low or high) of the clock signal.

Accordingly, the DETRET flip-flop 800 can be transitioned from a low-power operating mode to a normal operating mode without having to wait for the clock signal to transition to a phase that is associated with loading a particular input latch. For example, to load input latch 838 with the latched state (e.g., retained state) of output latch (e.g., retention latch) 834 without requiring the clock signal to be transitioned low before signal RET is deasserted.

Figure 9:
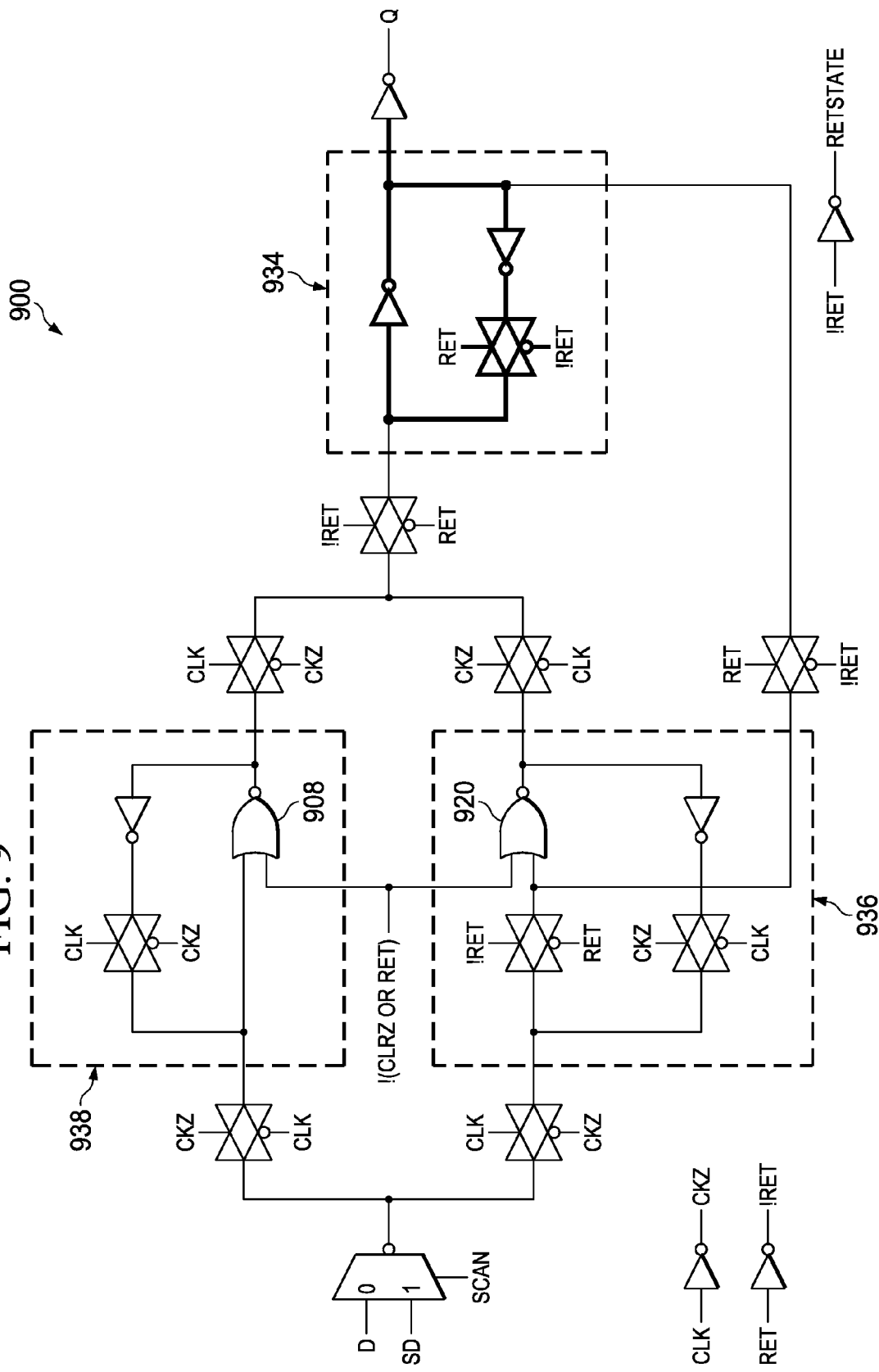
FIG. 9 is a schematic diagram illustrating a dual edge triggered retention (DETRET) flip-flop 900 having an asynchronous clear signal in accordance with exemplary embodiments of the disclosure.

FIG. 9 is a schematic diagram illustrating a dual edge triggered retention (DETRET) flip-flop 900 having an asynchronous clear signal in accordance with exemplary embodiments of the disclosure. The illustrated DETRET flip-flop 900 includes input latches 938 and 936, each of which has an output that is selectively coupled to output latch 934. In comparison with the DETRET flip-flop 700, DETRET flip-flop 900 includes circuitry (e.g., logic gates 908 and 920) that is arranged to receive an asynchronous clear (CLRZ) signal and in response, clear the logic state of each of the input latches (thus, e.g., setting the status of each of the input latches to a known state after an initial, wakeup condition).

Figure 10:
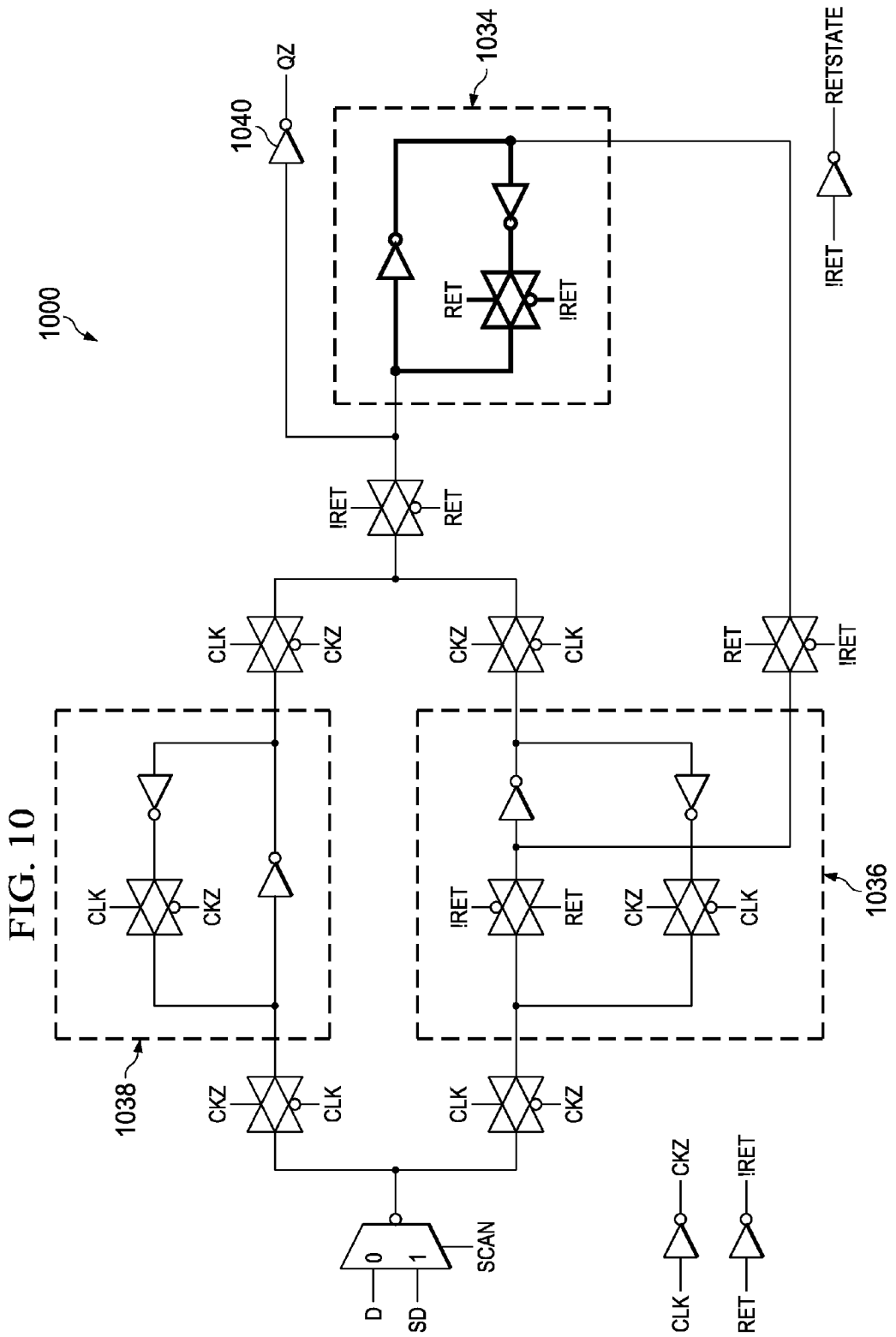
FIG. 10 is a schematic diagram illustrating a dual edge triggered retention (DETRET) flip-flop 1000 having reduced latency in accordance with exemplary embodiments of the disclosure.

FIG. 10 is a schematic diagram illustrating a dual edge triggered retention (DETRET) flip-flop 1000 having reduced latency in accordance with exemplary embodiments of the disclosure. The illustrated DETRET flip-flop 1000 includes input latches 1038 and 1036, each of which has an output that is selectively coupled to output latch 1034. In comparison with the DETRET flip-flop 700, DETRET flip-flop 1000 includes circuitry that is arranged to reduce the latency of the DETRET flip-flop. For example, DETRET flip-flop 1000 includes output gate 1040, which avoids a latency introduced by driving changing the feed-back circuitry in latch 1034.

Figure 11:
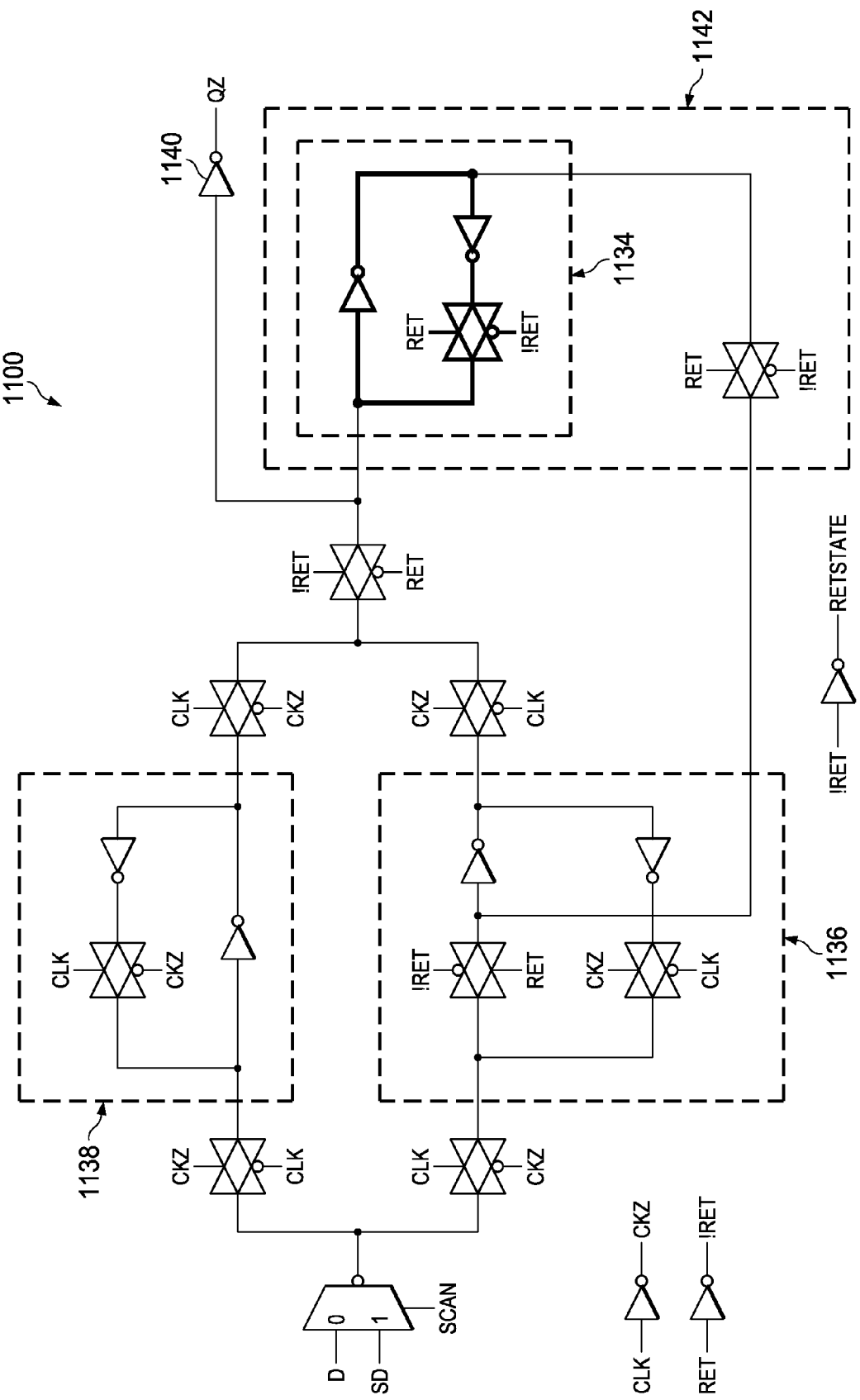
FIG. 11 is a schematic diagram illustrating a dual edge triggered retention (DETRET) flip-flop 1100 having reduced power consumption in a low power mode in accordance with exemplary embodiments of the disclosure.

FIG. 11 is a schematic diagram illustrating a dual edge triggered retention (DETRET) flip-flop 1100 having reduced power consumption in a low power mode in accordance with exemplary embodiments of the disclosure. The illustrated DETRET flip-flop 1100 includes input latches 1138 and 1136, each of which has an output that is selectively coupled to output latch 1134. In comparison with the DETRET flip-flop 1000, DETRET flip-flop 1100 includes transistors that are arranged to reduce the power consumption of the DETRET flip-flop a low power mode.

For example, DETRET flip-flop 1100 includes retention mode circuitry 1142, which is arranged using transistors that are formed using a high voltage threshold (HVT) design process. The HVT process reduces the power consumption that would otherwise be required during a low power operating mode. The latency of the DETRET flip-flop 1100 is not substantially reduced in normal operation when substantial portions (such as all transistors of DETRET flip-flop 1100 with the exception of retention mode circuitry 1142) of the DETRET flip-flop 1100 are arranged using a standard voltage threshold (SVT) design process. The DETRET flip-flop 1100 can be arranged as a non-inverting flip-flop when the inverter 1140 is replaced with a (e.g., non-inverting) buffer.

One or more implementations are described herein with reference to illustrations for particular applications. It should be understood that the implementations are not intended to be limiting. Those skilled in the art with access to the teachings provided herein will recognize additional modifications, applications, and implementations within the scope thereof and additional fields in which the technology would be of significant utility. In the above description of example implementations, for purposes of explanation, specific numbers, materials, configurations, and other details are set forth in order to better explain implementations as claimed. However, it will be apparent to one skilled in the art that the claims may be practiced using details different than the examples described herein. In other instances, well-known features are omitted or simplified to clarify the description of the example implementations.

For example, it will be appreciated that several of the above-disclosed and other features and functions, or alternatives thereof, may be combined into many other different systems or applications. Also, it will be appreciated that various presently unforeseen or unanticipated alternatives, modifications, variations or improvements therein may be subsequently made by those skilled in the art, which are also intended to be encompassed by the claims that follow.

As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more," unless specified otherwise or clear from context to be directed to a singular form.

The various embodiments described above are provided by way of illustration only and should not be construed to limit the claims attached hereto. Those skilled in the art will readily recognize various modifications and changes that could be made without following the example embodiments and applications illustrated and described herein, and without departing from the true spirit and scope of the following claims.

What is claimed is:

1. A flip-flop comprising:
   a first latch and a second latch, disposed on a substrate, wherein each of the first and second latches has an input coupled to an input pin, wherein the first latch is arranged to latch a first state of the input pin in response to a positive transition of a clock signal, wherein the second latch is arranged to latch a second state of the input pin in response to a negative transition of the clock signal; and
   a data state retention latch, disposed on the substrate, wherein the data state retention latch in a normal operating mode is arranged to latch the output of the first latch in response to a first transition of the clock signal and to latch the output of the second latch in response to a second transition of the clock signal that is opposite in direction to the first transition, and wherein the data state retention latch in a low-power operating mode is arranged to maintain a latched input state of for a length of time that exceeds a period of the clock signal.

2. The flip-flop according to claim 1, wherein the flip-flop is arranged during the low-power mode to maintain the output state of the data state retention latch over a period of time that includes a positive transition of the clock signal and an adjacent negative transition of the clock signal.

3. The flip-flop according to claim 1, wherein the flip-flop is arranged to leave the normal operating mode and enter the low-power operating mode while the clock signal is in a high state.

4. The flip-flop according to claim 3, wherein the flip-flop is arranged to set the logic state of at least one of the first and second latches in response to entering the normal operating mode.

5. The flip-flop according to claim 1 wherein the first and second latches have outputs that are gated by a signal that indicates the presence of the low-power operating mode.

6. The flip-flop according to claim 1, wherein the first and second latches are powered down during the low-power operating mode.

7. The flip-flop according to claim 1, wherein the first and second latches are arranged to latch a state of the input pin using transmission gates that are arranged to be gated by a signal that indicates the low-power operating mode.

8. The flip-flop according to claim 1, wherein the data state retention latch is arranged to maintain an active state during a low-power operating mode, wherein the data state retention latch is not power gated during the active state during the low-power operating mode.

9. The flip-flop according to claim 8, wherein the data state retention latch is arranged using transistors formed by a design process that has a higher voltage threshold than transistors used to form at least one of the first and second input latches, and wherein the data state retention latch is arranged to remain powered-up during the low-power operating mode.

10. The flip-flop according to claim 1, comprising a multiplexer that is arranged to select between the first input and a second input, wherein the latched first state is latched by latching a first state of the second input in response to a positive transition of the clock signal, and wherein the latched second state is latched by latching a second state of the second input in response to a negative transition of the clock signal.

11. A system comprising a flip-flop disposed on a substrate and comprising
    alternating input latches and an output latch, wherein the alternating input latches include a first input latch that is arranged to latch a first state of a first input in response to a first edge of a clock signal and a second input latch that is arranged to latch a second state of the first input in response to a second edge of the clock signal, wherein the output latch is coupled to each of the outputs of the alternating input latches, and wherein the output latch is arranged to retain the latched first state or the latched second state during a low-power mode; and
    a power distribution system that is arranged to selectively apply power to the alternating input latches and to the output latch during a normal operating mode and to decouple power from the alternating input latches during a low-power operating mode.

12. The system according to claim 11, wherein the state of the output latch is latched while transitioning from the low-power operating mode by at least one of the alternating latches in response to reconnecting power to the dual edge triggered circuit.

13. The system according to claim 11, wherein the first and second latches are arranged to latch the state of first input by using transmission gates that are arranged to be gated by a signal that indicates the low-power operating mode.

14. The system according to claim 11, wherein the output latch is arranged to maintain an active output during the low-power operating mode.

15. A method comprising:
    latching in a first latch a first logic state of an input in response to a first edge of a clock signal;
    latching in a second latch a second logic state of the input in response to a second edge of the clock signal, wherein the second edge transitions in a direction that is opposite the first edge;
    latching in an output latch one of the latched output states of the first and second latches in response to an assertion of a signal that indicates a low-power operating mode;
    maintaining the output state of the output latch in response to the assertion of a signal that indicates a low-power operating mode; and
    conserving power in the first and second latches during the low-power operating mode.

16. The method of claim 15, wherein the conserving power includes removing power from the in the latches used to latch the first and second states.

17. The method of claim 16, comprising using the latched output state of the output latch to initialize at least one of the first and second latches before transitioning from the low-power operating mode.

* * * * *